(12) United States Patent
Wang et al.

(10) Patent No.: US 8,605,383 B1
(45) Date of Patent: Dec. 10, 2013

(54) METHODS, DEVICES AND SYSTEMS FOR CHARACTERIZING POLARITIES OF PIEZOELECTRIC (PZT) ELEMENTS OF A TWO PZT ELEMENT MICROACTUATOR

(75) Inventors: Xin Wang, San Jose, CA (US); Yanning Liu, San Ramon, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 22 days.

(21) Appl. No.: 13/476,616

(22) Filed: May 21, 2012

(51) Int. Cl.
*G11B 21/02* (2006.01)
*G01R 29/22* (2006.01)

(52) U.S. Cl.
USPC .............. 360/75; 324/727; 324/537; 310/311

(58) Field of Classification Search
None
See application file for complete search history.

(56) References Cited

U.S. PATENT DOCUMENTS

| | | |
|---|---|---|
| 2,728,222 A | 12/1955 | Becker et al. |
| 4,760,358 A | 7/1988 | Inoue |
| 5,118,982 A | 6/1992 | Inoue et al. |
| 5,262,643 A | 11/1993 | Hammond et al. |
| 5,301,558 A | 4/1994 | Livingston et al. |
| RE37,030 E | 1/2001 | Lloyd et al. |
| 6,249,890 B1 | 6/2001 | Ukani et al. |
| 6,510,752 B1 | 1/2003 | Sacks et al. |
| 6,556,028 B1 | 4/2003 | Umanskiy et al. |
| 6,556,933 B1 | 4/2003 | Sacks et al. |
| 6,639,411 B1 | 10/2003 | Thomsen |
| 6,831,807 B2 | 12/2004 | Koso et al. |
| 6,861,854 B1 | 3/2005 | Guo et al. |
| 6,870,377 B2 | 3/2005 | Thomsen |
| 6,895,547 B2 | 5/2005 | Eleftheriou et al. |
| 6,975,477 B1 | 12/2005 | Hu et al. |
| 6,977,793 B2 | 12/2005 | White et al. |
| 7,009,804 B2 | 3/2006 | Sharma et al. |
| 7,062,698 B2 | 6/2006 | Yang |
| 7,072,134 B1 | 7/2006 | Hirano et al. |
| 7,072,417 B1 | 7/2006 | Burd et al. |
| 7,075,748 B2 | 7/2006 | White et al. |
| 7,079,338 B1 | 7/2006 | Semba et al. |
| 7,079,339 B1 | 7/2006 | Semba et al. |
| 7,106,552 B2 | 9/2006 | Hirano et al. |
| 7,124,654 B1 | 10/2006 | Davies et al. |
| 7,184,230 B1 | 2/2007 | Chue et al. |
| 7,336,434 B2 | 2/2008 | Lille et al. |
| 7,346,832 B2 | 3/2008 | Richardson et al. |
| 7,395,490 B2 | 7/2008 | Richardson et al. |

(Continued)

FOREIGN PATENT DOCUMENTS

| | | |
|---|---|---|
| UA | 20940 | 2/2007 |
| UA | 20943 | 2/2007 |
| WO | WO2009128546 | 10/2009 |

OTHER PUBLICATIONS

Bernhard M.J. Leiner, "LDPC Codes—a brief Tutorial", Stud. ID: 53418L, Apr. 8, 2005, pp. 1-9.

*Primary Examiner* — Andrew L Sniezek

(57) ABSTRACT

A method for characterizing polarities of piezoelectric (PZT) elements of a two-element PZT microactuator mechanically coupled to a structure may include calculating an impedance of the two PZT element microactuator over a predetermined frequency range; summing the calculated impedance over the predetermined frequency range; and characterizing the polarities of the PZT elements of the two PZT element microactuator as being different if the summed impedance is greater than a threshold value and as being the same if the summed impedance is less than or equal to the threshold value.

20 Claims, 3 Drawing Sheets

(56) References Cited

U.S. PATENT DOCUMENTS

| | | |
|---|---|---|
| 7,423,837 B2 | 9/2008 | Hutsell |
| 7,657,816 B2 | 2/2010 | Cohen et al. |
| 7,768,276 B2 | 8/2010 | Yao |
| 7,814,393 B2 | 10/2010 | Kyung et al. |
| 7,913,149 B2 | 3/2011 | Gribok et al. |
| 8,322,235 B1 | 12/2012 | Keopuang et al. |
| 8,335,049 B1 | 12/2012 | Liu et al. |
| 2003/0037298 A1 | 2/2003 | Eleftheriou et al. |
| 2003/0065992 A1 | 4/2003 | Yang |
| 2003/0076121 A1 | 4/2003 | Guo et al. |
| 2004/0098659 A1 | 5/2004 | Bjerke et al. |
| 2005/0204253 A1 | 9/2005 | Sukhobok et al. |
| 2005/0216821 A1 | 9/2005 | Harada |
| 2005/0246617 A1 | 11/2005 | Kyung et al. |
| 2006/0036925 A1 | 2/2006 | Kyung et al. |
| 2006/0036933 A1 | 2/2006 | Blankenship et al. |
| 2006/0171062 A1 | 8/2006 | Hirano et al. |
| 2008/0165444 A1 | 7/2008 | Zafer |
| 2009/0249159 A1 | 10/2009 | Lee et al. |
| 2009/0303839 A1 | 12/2009 | Narayanan et al. |
| 2010/0037674 A1 | 2/2010 | Yashchuk et al. |
| 2010/0100788 A1 | 4/2010 | Yang et al. |
| 2011/0299197 A1* | 12/2011 | Eguchi .......................... 360/274 |

* cited by examiner

US 8,605,383 B1

METHODS, DEVICES AND SYSTEMS FOR CHARACTERIZING POLARITIES OF PIEZOELECTRIC (PZT) ELEMENTS OF A TWO PZT ELEMENT MICROACTUATOR

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write. For convenience, all heads that can read are referred to as "read heads" herein, regardless of other devices and functions the read head may also perform (e.g. writing, flying height control, touch down detection, lapping control, etc.).

In a modern magnetic hard disk drive device, each read head is a sub-component of a head gimbal assembly (HGA). The read head typically includes a is slider and a read/write transducer. The read/write transducer typically comprises a magneto-resistive read element (e.g. so-called giant magneto-resistive read element, or a tunneling magneto-resistive read element) and an inductive write structure comprising a flat coil deposited by photolithography and a yoke structure having pole tips that face a disk media.

The HGA typically also includes a suspension assembly with a laminated flexure to carry the electrical signals to and from the read head. The read head is typically bonded to a tongue feature of the laminated flexure. The HGA, in turn, is a sub-component of a head stack assembly (HSA) that typically includes a plurality of HGAs, a rotary actuator, and a flex cable. The plurality of HGAs are attached to various arms of the rotary actuator, and each of the laminated flexures of the HGAs has a flexure tail that is electrically connected to the HSA's flex cable.

The position of the HSA relative to the spinning disks in a disk drive, and therefore the position of the read heads relative to data tracks on the disks, is actively controlled by the rotary actuator which is typically driven by a voice coil motor (VCM). Specifically, electrical current passed through a coil of the VCM applies a torque to the rotary actuator, so that the read head can seek and follow desired data tracks on the spinning disk.

However, the industry trend towards increasing areal data density has necessitated substantial reduction in the spacing between data tracks on the disk. Also, disk drive performance requirements, especially requirements pertaining to the time required to access desired data, have not allowed the rotational speed of the disk to be reduced. In fact, for many disk drive applications, the rotational speed has been significantly increased. A consequence of these trends is that increased bandwidth is required for servo control of the read head position relative to data tracks on the spinning disk.

As the density of the data tracks increases, a microactuator may be employed in combination with the VCM to improve the tracking performance of the servo system. Some of these designs utilize one or more piezoelectric (PZT) microactuators that are affixed to a stainless steel component of the suspension assembly (e.g. the mounting plate or an extension thereof, and/or the load beam or an extension thereof, and/or an intermediate stainless steel part connecting the mounting plate to the load beam). Any suitable microactuator may be employed, such as a PZT actuator.

Some two element PZT microactuators include a first PZT element of a first polarity and a second PZT element of a second polarity. Occasionally, unbeknownst to the suppliers thereof, microactuators are shipped with both PZT elements of the same polarity. Such defective same polarity two PZT element microactuators are otherwise indistinguishable from non-defective, different polarity two element microactuators during the high volume manufacturing processes. The defectiveness of the same polarity microactuators only becomes apparent when the drive fails to operate, whereupon it is discovered that the drive fails to operate because the microactuator has effectively zero stroke; that is, it cannot move or respond appropriately to applied voltage. Such defective drives are costly and decrease the yield of the high volume manufacturing process.

DETAILED DESCRIPTION

Figure 1:
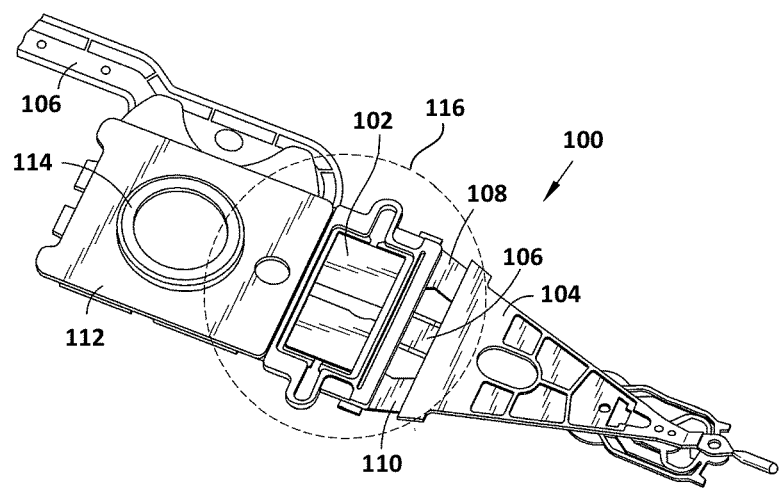
FIG. 1 is a diagram of an HGA comprising a microactuator.

FIG. 1 is a top perspective view of an exemplary suspension assembly 100 comprising a microactuator 102. As shown in FIG. 1, the suspension assembly 100 comprises a load beam 104 and a laminated flexure 106 attached to the load beam 104. The load beam 104 may comprise hinge plates 108 and 110, and may be attached to a suspension assembly mounting plate 112 via the hinge plates 108 and 110. These components may be made of stainless steel, and their attachments to each other may be made by spot welding, for example. Alternatively, the load beam 104 may have integral hinge plate regions rather than being assembled with separate hinge plate components, so that the load beam 104 and its hinge plates would be a single component having material continuity. The suspension assembly mounting plate 112 may comprise a swage boss 114 to facilitate attachment of the suspension assembly to an actuator arm of a HSA.

Figure 2:
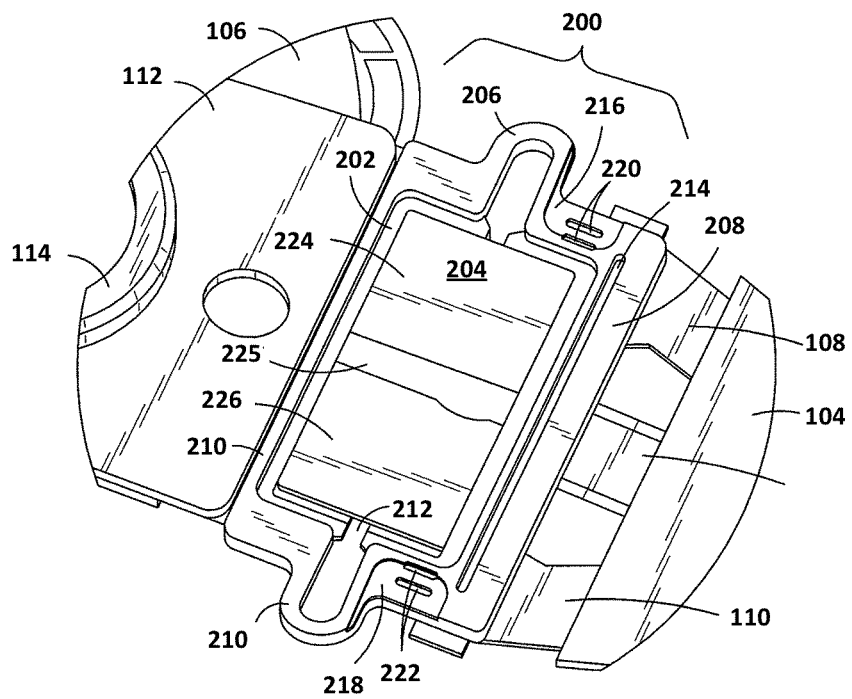
FIG. 2 is a diagram showing details of the HGA of FIG. 1.

FIG. 2 is an expanded view of the region of the suspension assembly 100 that is labeled 116 in FIG. 1. Now referring additionally to FIG. 2, the suspension assembly mounting plate 112 can be seen to include a microactuator mounting structure 200 extending from the suspension assembly mounting plate 112. As shown in FIG. 2, the microactuator mounting structure 200 may comprise a partially etched well 202 into which the microactuator 204 may be placed. The microactuator 204 may be adhered to the microactuator mounting structure 200 by an adhesive (such as UV cured epoxy, thermal set epoxy, for example), and such adhesive or another encapsulate material may be disposed around the periphery of the microactuator 204 and within the partially etched well 202 to help prevent particle shedding. This effectively mechanically couples the microactuator 204 to its mounting structure 200.

As shown, the microactuator mounting structure 200 may comprise at least one compliant arm 206 so that the microactuator 204 can move a distal portion 208 relative to an anchored portion 210 of the microactuator mounting structure 200. For example, the microactuator mounting structure 200 may comprise two compliant arms 206 and 210, so that the microactuator mounting structure encompasses a window 212. The window 212 is dimensioned so that it can be spanned by microactuator 204.

The load beam 104 extends from the distal portion 208 of the microactuator mounting structure 200, in that the load beam 104 comprises the hinge plates 108 and 110 that are attached to and extend from the distal portion 208 of the microactuator mounting structure 200. The distal portion 208 of the microactuator mounting structure 200 may comprise an adhesive-limiting trench 214 to help prevent adhesive from reaching and potentially undesirably affecting the structural characteristics of the hinge plates 108, 110. The microactuator mounting structure 200 of the suspension assembly 100 may comprise a stainless steel surface having two regions 216 and 218 that may be coated with a conductive inert layer and configured as an electrical connection region. The two regions 216 and 218 of the stainless steel surface of the microactuator mounting structure 200 may comprise partial etched trenches 220 and 222, respectively.

The microactuator 204 may comprise top electrodes 224 and 226, separated by an isolation region 225. Beneath the top electrode 224 is one PZT element of the two-PZT element microactuator 204. Similarly, beneath the top electrodes 226 is the other PZT element of the two-PZT element microactuator 204. The PZT element located beneath the top electrode 224 is polarized differently than the PZT element located beneath the top electrode 226. Such different polarity between the PZT elements beneath the top electrodes 224, 226 enables differential motion despite the application of a common electrical field from a common bottom electrode (not shown). Alternatively, the PZT element located beneath the top electrode 224 may be identically polarized as is the PZT element located beneath the top electrode 226. Such same polarity between the PZT elements beneath the top electrodes 224, 226 enables differential motion despite the application of oppositely polarized electrical fields from a separate bottom electrodes (not shown). It is to be noted that FIGS. 1 and 2 show only one illustrative example of a suspension assembly, and that those of skill in this art may recognize that other structures are possible, within the present context.

When the microactuator 204 is embedded, bonded or otherwise mechanically coupled to a mechanical structure such as suspension assembly 100, the piezoelectric impedance is coupled to the mechanical impedance of the mechanical structure; that is, to the mechanical impedance of the suspension, HGA or HSA. One embodiment is a method for characterizing polarities of PZT elements of a two-element PZT microactuator mechanically coupled to a structure. Such a method may find uses in electrically screening out the microactuator failure mode in which commonly-driven PZT elements of the two-element PZT microactuator are of the same polarity or in which oppositely-driven PZT elements of the two-element PZT microactuator are of different polarities.

Figure 3:
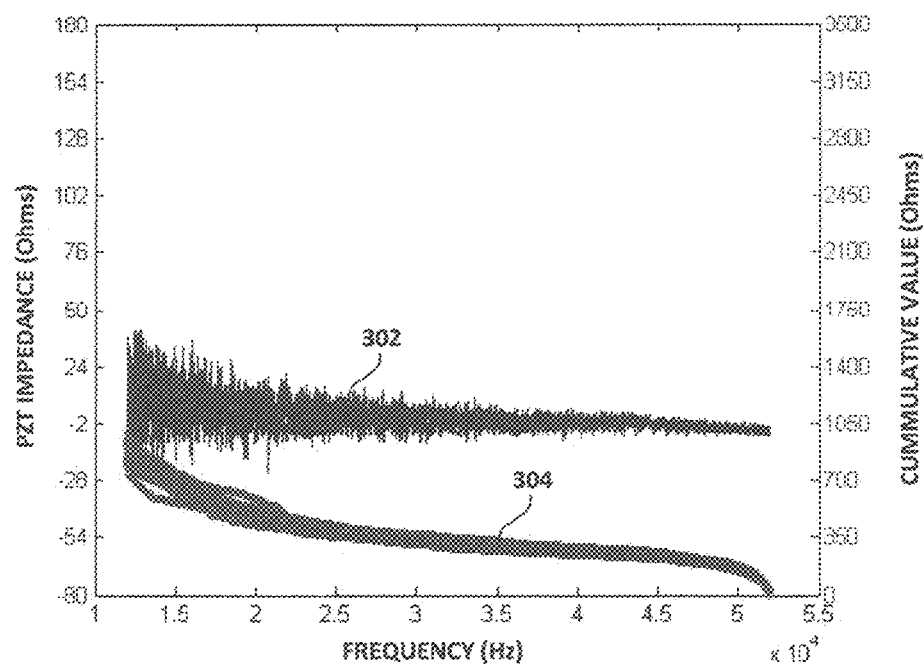
FIG. 3 is a graph of the PZT impedance of a plurality two element PZT microactuators coupled to a corresponding plurality of HGAs, according to one embodiment.

FIG. 3 is a graph of the PZT impedance of a plurality two element PZT microactuators coupled to a corresponding plurality of HGAs, according to one embodiment. Specifically, FIG. 3 is a graph of the PZT impedance of a sample population of 14 microactuators, each coupled to a respective one of 14 HGAs. The PZT impedance of the 14 microactuators coupled to the 14 HGAs is shown at 302 across a predetermined frequency range (in this case, from about 12 kHz to about 55 kHz). The ordinate for the PZT impedance curves 302 is on the left, and is in ohms. The cumulative PZT impedance curves are shown at 304, and are summed from right to left, starting at about 52 kHz. As shown, the PZT impedance curves 302 exhibit little variation, and no substantial peaks above the noise level. In fact, the profile of the PZT impedance curves 302 resembles that of a decaying exponential curve over the predetermined frequency range. Moreover, the final values of the cumulative impedance curves 304, shown at the left at about 12 kHz, vary from about −28 to about −2, never breaking into positive territory.

Figure 4:
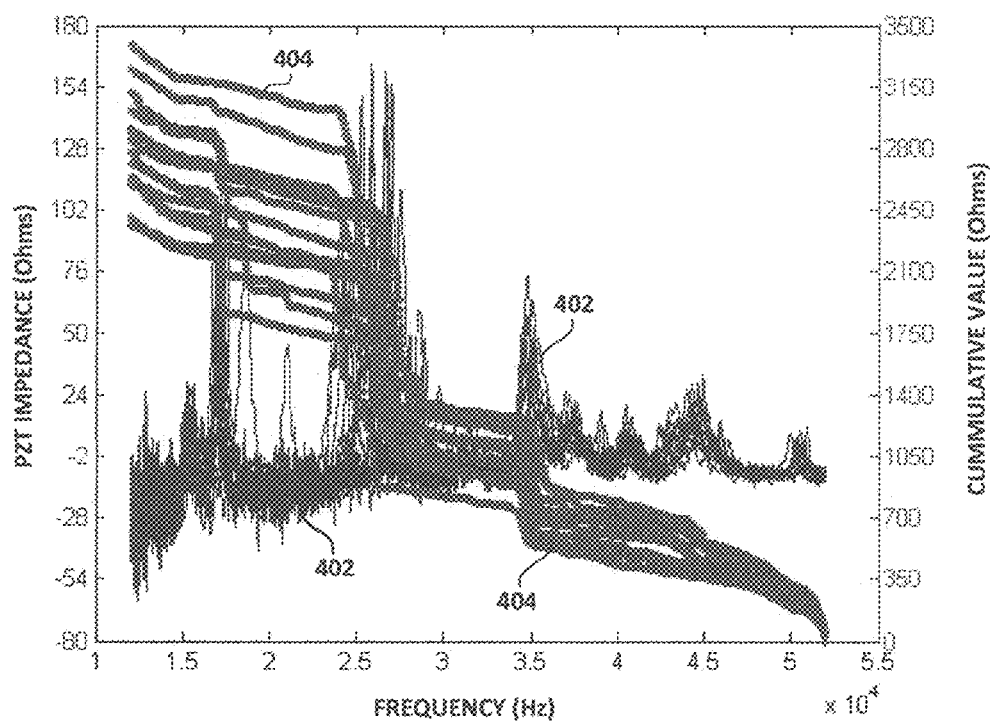
FIG. 4 is a graph of the PZT impedance of a plurality two element PZT microactuators coupled to a corresponding plurality of HGAs, according to one embodiment.

FIG. 4 is a graph of the PZT impedance of a plurality two element PZT microactuators coupled to a corresponding plurality of HGAs, according to one embodiment. Specifically, FIG. 4 is a graph of the PZT impedance of a population of 14 microactuators, each coupled to a respective one of 14 HGAs. The PZT impedance of the 14 microactuators coupled to the 14 HGAs is shown at 402 across a predetermined frequency range (in this case, from about 12 kHz to about 55 kHz). The ordinate for the PZT impedance curves 402 is on the left, and is in ohms. The cumulative PZT impedance curves are shown at 404, and are summed from right to left, starting at about 52 kHz. As shown, the PZT impedance curves 402 exhibit a plurality of substantial (e.g., above the noise level) and pronounced peaks; notably, at about 18 kHz, 26 kHz and 35 kHz. Moreover, the final values of the cumulative impedance 404, shown at the left at about 12 kHz, vary from about 100 to about 175, greatly exceeding the final values of the cumulative impedances 304 in FIG. 3.

From inspection of the graphs of FIGS. 3 and 4, it may be seen that the two sets of impedance curves 302 and 402 differ in their general shape or envelope. One embodiment is at least partly predicated upon the discovery that the impedance curves for two PZT element microactuators where the two PZT actuators are of the same polarity (e.g., as shown in FIG. 3) differ significantly from the impedance curves for two PZT element microactuators where the two PZT actuators are of different or opposite polarity (e.g., as shown in FIG. 4), provided the same excitation voltage is applied to each of the two PZT elements. That is, the profile of impedance curves for two PZT element microactuators where the two PZT actuators are of the same polarity differs in a consistent and predictable manner from the impedance curves for two PZT element microactuators where the two PZT actuators are of different or opposite polarity. The different profiles provide an avenue to electrically screen those microactuators whose commonly-driven constituent PZT elements are of the same polarity or those microactuators whose differentially-driven constituent PZT elements are of different polarities and which would, if incorporated into a disk drive, not work as intended (i.e., would have little or zero microactuator stroke). Moreover, the sum of the impedances, shown at curves 304 and 404 in FIGS. 3 and 4, respectively, are quantitatively different, depending upon whether the two PZT actuators are of the same polarity or are of different or opposite polarity.

In fact, FIG. 3 shows the impedance curves of microactuators coupled to HGAs, where the commonly-driven constituent PZT elements of the microactuators are of the same polarity or where the differentially-driven constituent PZT elements are of different polarities. FIG. 4 shows the impedance curves of microactuators coupled to HGAs, where the commonly-driven constituent PZT elements of the microactuators are of different or opposite polarities or where the differentially-driven constituent PZT elements of the microactuators are of the same polarity. One embodiment of a method for characterizing polarities of PZT elements of a two-element PZT microactuator mechanically coupled to a structure, therefore, comprises calculating an impedance of the two PZT element microactuator over a predetermined frequency range; and characterizing the polarity of each PZT element of the two PZT element microactuator based on the calculated impedance over the frequency range. The impedances may be calculated by applying a predetermined voltage to the microactuator over a predetermined frequency range (say, from 12 kHz to about 52 kHz, for example) and measuring a resultant current flowing through the microactuator. The ratio of the applied voltage over the predetermined frequency range to the measured current gives an indication of the impedance over the predetermined frequency range.

According to one embodiment, the method may further comprise determining the presence of a plurality of substantial peaks above a noise level in the calculated impedance over the frequency range. For example, if a plurality of substantial peaks are determined not to be present, as shown in FIG. 3, then it may be inferred that the polarities of the PZT elements of the two PZT element microactuator are the same (i.e., either both positive or both negative). Alternatively, if a plurality of peaks is determined to be present in the impedance curve over the predetermined frequency range, as shown in FIG. 4, then it may be inferred that the polarities of the PZT elements of the two PZT element microactuator are different from one another (i.e., one positive and the other negative). According to one embodiment, one or more of the substantial peaks occur at frequencies (as shown in the example of FIG. 4, at about 18 kHz, 26 kHz and 35 kHz) that are above the noise level and that correspond to mechanical resonance modes of the structure to which the microactuator is mechanically coupled. Such structures may comprise, according to one embodiment, a suspension assembly, an HGA and/or a HSA of a disk drive being manufactured.

Figure 5:
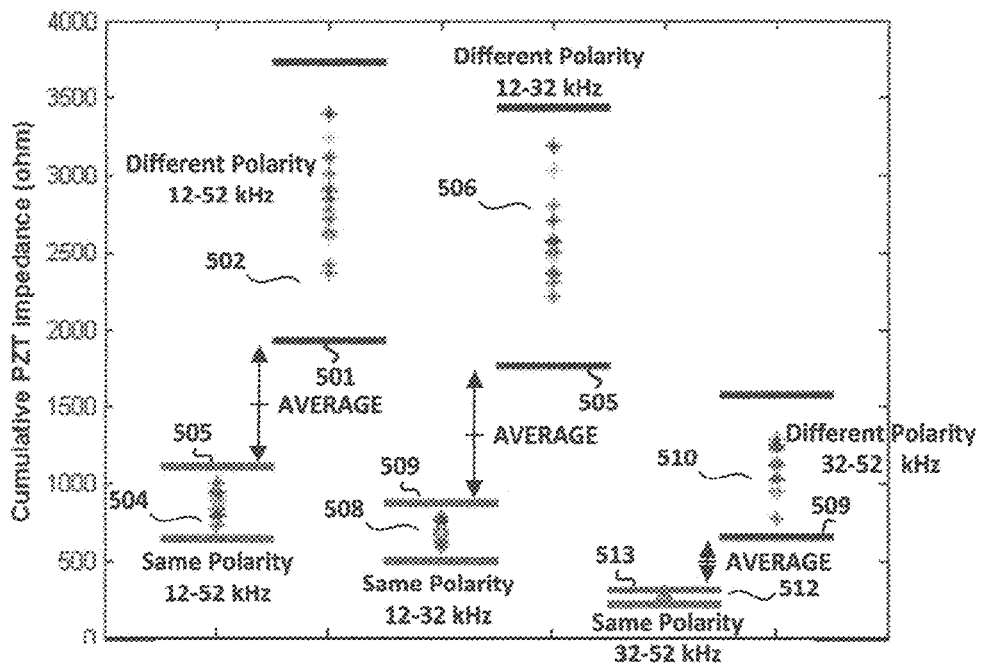
FIG. 5 is a graph of a cumulative impedance distribution and three standard deviation (3σ) bars of a plurality two element PZT microactuators coupled to a corresponding plurality of HGAs, according to one embodiment.

FIG. 5 is a graph of a cumulative impedance distribution and three is standard deviation (three-sigma or 3σ) bars of a plurality two element PZT microactuators coupled to a corresponding plurality of HGAs, according to one embodiment. According to one embodiment, a method for characterizing polarities of PZT elements of a two-element PZT microactuator mechanically coupled to a structure may comprise calculating an impedance of the two PZT element microactuator over a predetermined frequency range. The calculated impedance may then be summed over the predetermined frequency range. This summing of the calculated (measured or otherwise obtained) impedance over a predetermined frequency range may then be represented as a single data point, in ohms, as shown in FIG. 5. FIG. 5 shows a plurality of distributions of such data points, each representing the sum of the impedance of the two PZT element microactuator over the indicated frequency range. As shown, the data points of the impedance distribution 502, corresponding to two-element microactuators whose constituent PZT elements are of different polarities, were measured or calculated over a 12 kHz to 52 kHz range. The data points of impedance distribution 504, corresponding to two-element microactuators whose constituent PZT elements are of the same polarity, were measured or calculated over the same 12 kHz to 52 kHz range. Similarly, the data points of the impedance distribution 506, corresponding to two-element microactuators whose constituent PZT elements are of different polarities, were measured or calculated over a 12 kHz to 32 kHz range. The data points of impedance distribution 508, corresponding to two-element microactuators whose constituent PZT elements are of the same polarity, were measured or calculated over the same 12 kHz to 32 kHz range. The data points of the impedance distribution 510, corresponding to two-element microactuators whose constituent PZT elements are of different polarities, were measured or calculated over a 32 kHz to 52 kHz range. Lastly, the data points of impedance distribution 512, corresponding to two-element microactuators whose constituent PZT elements are of the same polarity, were measured or calculated over the same 32 kHz to 52 kHz range.

As noted with respect to FIGS. 3 and 4, there is a substantial spread between the cumulative impedance values for two-element microactuators whose constituent PZT elements are of the same polarity and for those whose constituent PZT elements are of different polarities. In the embodiment of FIG. 5, this spread is utilized to characterize the polarities of the PZT elements, depending upon whether the value of the cumulative impedance of the microactuator under test is greater than or less than or equal to a threshold value. According to one embodiment, the constituent PZT elements of a two PZT element microactuator under test may be characterized as being of different polarities if the summed impedance is greater than a threshold value and as being the same if the summed impedance is less than or equal to the threshold value.

According to one embodiment, such a threshold value may be selected between the data point of the distribution 504 whose value is greatest and the data point of the distribution 502 whose value is the lowest. That is, the threshold value may be selected as being between a highest value of a distribution of summed impedances for two PZT element microactuators having been characterized as being of the same polarity and a lowest value of a distribution of summed impedances for two PZT element microactuators having been characterized as being of different polarities. According to one embodiment, such a threshold value may be calculated to be equal to an average of the highest value of a distribution of summed impedances for two PZT element microactuators having been characterized as being of the same polarity and a lowest value of a distribution of summed impedances for two PZT element microactuators having been characterized as being of different polarities.

The bars in FIG. 5 bounding the distributions 502, 504, 506, 508, 510 and 512 are three sigma (3σ) distribution bars, meaning that they represent the value of the third standard deviation of the distribution, both at the high and low ends of each distribution of data points. As those of skill in this art will recognize, other metrics may be used to bound the distribution of summed impedances, so as to enable a different selection for the threshold value. According to one embodiment, the threshold value may be selected as an average of a three standard deviations highest value of a distribution of summed impedances for two PZT element microactuators having been characterized as being of the same polarity and a three standard deviation lowest value of the distribution of summed impedances for two PZT element microactuators having been characterized as being of different polarities.

As shown in FIG. 5, according to one embodiment, the threshold value may be selected as an average of a three standard deviations highest value 505 of the distribution 504 of summed impedances for two PZT element microactuators having been characterized as being of the same polarity and a three standard deviation lowest value 501 of the distribution 502 of summed impedances for two PZT element microactuators having been characterized as being of different polarities, over a predetermined frequency range; in this case, 12 kHz to 52 kHz. As also shown in FIG. 5, according to one embodiment, the threshold value may be selected as an average of a three standard deviations highest value 509 of the distribution 508 of summed impedances for two PZT element microactuators having been characterized as being of the same polarity and a three standard deviation lowest value 505 of the distribution 506 of summed impedances for two PZT element microactuators having been characterized as being of different polarities, over a predetermined frequency range; in this case, 12 kHz to 32 kHz. Lastly and as also shown in FIG. 5, according to one embodiment, the threshold value may be selected as an average of a three standard deviations highest value 513 of the distribution 512 of summed impedances for two PZT element microactuators having been characterized as being of the same polarity and a three standard deviation lowest value 509 of the distribution 510 of summed impedances for two PZT element microactuators having been characterized as being of different polarities, over a predetermined frequency range; in this case, 32 kHz to 52 kHz.

Figure 6:
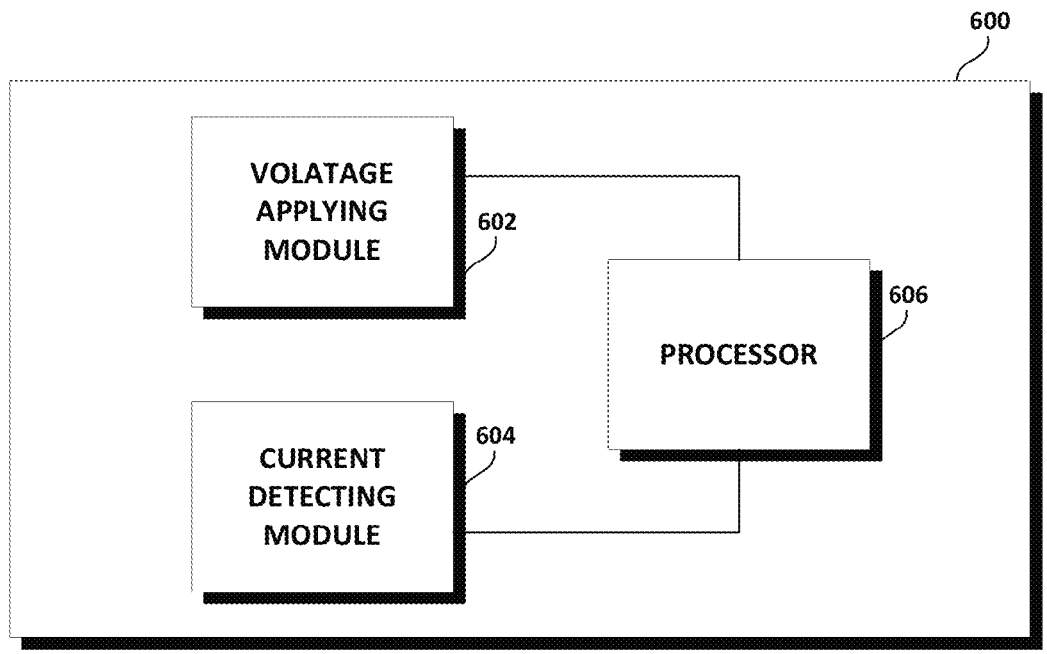
FIG. 6 is a block diagram of a device for characterizing the polarities of PZT elements according to one embodiment.

According to one embodiment, the PZT impedance of the microactuator may be calculated at relatively low frequencies, e.g., up to about 55 kHz. Therefore, during high-volume manufacturing, a self-developed function block incorporating one embodiment may be embedded into the software of a test device, for real-time PZT impedance measuring and evaluation. Therefore, according to one embodiment, a device 600 to determine polarities of PZT elements of a two PZT microactuator mechanically coupled to a structure may comprise, as shown in FIG. 6, a voltage applying module 602 configured to apply a predetermined voltage to the two PZT element microactuator over a frequency range and a current detecting module 604 configured to detect a current flowing through the two PZT element microactuator as a result of the applied predetermined voltage. A processor 606 may be coupled to both modules 602, 604, with the processor being configured to calculate an impedance from the applied predetermined voltage and the detected current. The processor 606 may also be configured to characterize polarities of the PZT elements of the two PZT element microactuator based on the calculated impedance over the frequency range. As noted above relative to FIGS. 3-5, the processor may be further configured to sum the calculated impedance over the predetermined frequency range and characterize the polarities of the PZT elements of the two PZT element microactuator as being different if the summed impedance is greater than a threshold value and as being the same if the summed impedance is less than or equal to the threshold value. The threshold value may be selected to be between a highest value of a distribution of summed impedances for two PZT element microactuators having been characterized as being of the same polarity and a lowest value of a distribution of summed impedances for two PZT element microactuators having been characterized as being of different polarities. Alternatively, the threshold value may be selected as an average of a three standard deviations highest value of a distribution of summed impedances for two PZT element microactuators having been characterized as being of the same polarity and a three standard deviation lowest value of summed impedances for two PZT element microactuators having been characterized as being of different polarities.

It is to be noted that the foregoing assumes that the two PZT element microactuator incorporated into the suspension assembly, the HGA and/or the HAS is driven by a same control voltage, such that each of the two oppositely-polarized PZT elements reacts differently to the applied voltage. However, it is also to be noted that each of the two PZT elements of the microactuator incorporated into the suspension assembly, the HGA and/or the HSA may be designed to be driven by separate and oppositely signed voltages. In that case, both elements of the two PZT element microactuator may be of the same polarity, be driven by oppositely signed control voltages and still exhibit the designed-for microactuator stroke. Similarly, in the case in which the two PZT elements of the microactuator incorporated into the suspension assembly, the HGA and/or the HAS are driven by separate and oppositely signed voltages and the microactuator comprises two same polarity PZT elements, the impedance of the microactuator will still be properly characterized and the resultant microactuator will be correctly identified as being defective, as having little to zero stroke.

Accordingly, microactuators with the wrong polarity PZT elements may be effectively screened out at the suspension assembly, or at the HGA or HSA level. Currently, HGA/HSA processing lines do not have the ability to screen out such a failure mode, as the capacitance of wrong-polarity microactuators is the same as the capacitance of correct-polarity microactuators. Moreover, there is no need for additional sensor to characterize the polarity, as the PZT elements themselves are used as the sensor, according to one embodiment. Such characterization, according to one embodiment, may be conveniently integrated into high volume manufacturing lines by, for example, embedding a functional block incorporating one embodiment into a test device, such as a Quasi Static Tester (QST) to measure the PZT impedance, then calculate the cumulative value and characterize the polarity of the microactuator.

While certain embodiments of the inventions have been described, these embodiments have been presented by way of example only, and are not intended to limit the scope of the inventions. Indeed, the novel methods, devices and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, those skilled in the art will appreciate that in various embodiments, the actual structures (such as, for example,) may differ from those shown in the figures. Depending on the embodiment, certain of the steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. A method for characterizing polarities of piezoelectric (PZT) elements of a two PZT element microactuator mechanically coupled to a structure, comprising:
    calculating an impedance of the two PZT element microactuator over a predetermined frequency range; and
    characterizing the polarity of each PZT element of the two PZT element microactuator based on the calculated impedance over the frequency range.

2. The method of claim 1, further comprising determining a presence of a plurality of substantial peaks above a noise level in the calculated impedance over the frequency range, at least some of the plurality of substantial peaks occurring at frequencies corresponding to mechanical resonance modes of the structure.

3. The method of claim 2, wherein characterizing comprises determining that the polarities of the PZT elements of the two PZT element microactuator are different if the plurality of substantial peaks is determined to be present.

4. The method of claim 2, wherein characterizing comprises determining that the polarities of the PZT elements of the two PZT element microactuator are the same if the plurality of substantial peaks is determined not to be present.

5. The method of claim 1, wherein the structure comprises a suspension of a head gimbal assembly of a disk drive.

6. The method of claim 1, wherein the structure comprises a head gimbal assembly (HGA) of a disk drive.

7. The method of claim 1, wherein the structure comprises a head stack assembly (HSA) of a disk drive.

8. A method for characterizing polarities of piezoelectric (PZT) elements of a two-PZT element microactuator mechanically coupled to a structure, comprising:
   calculating an impedance of the two PZT element microactuator over a predetermined frequency range;
   summing the calculated impedance over the predetermined frequency range;
   characterizing the polarities of the PZT elements of the two PZT element microactuator as being different if the summed impedance is greater than a threshold value and as being the same if the summed impedance is less than or equal to the threshold value.

9. The method of claim 8, wherein the structure comprises a suspension of a head gimbal assembly of a disk drive.

10. The method of claim 8, wherein the structure comprises a head gimbal assembly (HGA) of a disk drive.

11. The method of claim 8, wherein the structure comprises a head stack assembly (HSA) of a disk drive.

12. The method of claim 8, wherein the threshold value is between a highest value of a distribution of summed impedances for two PZT element microactuators having been characterized as being of the same polarity and a lowest value of a distribution of summed impedances for two PZT element microactuators having been characterized as being of different polarities.

13. The method of claim 8, wherein the threshold value is an average of a three standard deviations highest value of a distribution of summed impedances for two PZT element microactuators having been characterized as being of the same polarity and a three standard deviation lowest value of summed impedances for two PZT element microactuators having been characterized as being of different polarities.

14. A device to determine polarities of piezoelectric (PZT) elements of a two PZT element microactuator mechanically coupled to a structure, comprising:

a voltage applying module configured to apply a predetermined voltage to the two PZT element microactuator over a frequency range;
   a current detecting module configured to detect a current flowing through the two PZT element microactuator as a result of the applied predetermined voltage; and
   a processor, configured to:
      calculate an impedance from the applied predetermined voltage and the detected current; and
      characterize polarities of the PZT elements of the two PZT element microactuator based on the calculated impedance over the frequency range.

15. The device of claim 14, wherein the structure comprises a suspension of a head gimbal assembly of a disk drive.

16. The device of claim 14, wherein the structure comprises a head gimbal assembly (HGA) of a disk drive.

17. The device of claim 14, wherein the structure comprises a head stack assembly (HSA) of a disk drive.

18. The device of claim 14, wherein the processor is further configured to characterize the polarities by:
   summing the calculated impedance over the predetermined frequency range; and
   characterizing the polarities of the PZT elements of the two PZT element microactuator as being different if the summed impedance is greater than a threshold value and as being the same if the summed impedance is less than or equal to the threshold value.

19. The device of claim 18, wherein the threshold value is between a highest value of a distribution of summed impedances for two PZT element microactuators having been characterized as being of the same polarity and a lowest value of a distribution of summed impedances for two PZT element microactuators having been characterized as being of different polarities.

20. The device of claim 18, wherein the threshold value is an average of a three standard deviations highest value of a distribution of summed impedances for two PZT element microactuators having been characterized as being of the same polarity and a three standard deviation lowest value of summed impedances for two PZT element microactuators having been characterized as being of different polarities.

* * * * *